United States Patent
Suto et al.

(10) Patent No.: US 11,621,402 B2
(45) Date of Patent: Apr. 4, 2023

(54) LAMINATE, ORGANIC THIN-FILM SOLAR CELL, METHOD FOR PRODUCING LAMINATE, AND METHOD FOR PRODUCING ORGANIC THIN-FILM SOLAR CELL

(71) Applicant: JFE Steel Corporation, Tokyo (JP)

(72) Inventors: Mikito Suto, Tokyo (JP); Hiroyuki Masuoka, Tokyo (JP); Akira Matsuzaki, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 59 days.

(21) Appl. No.: 17/297,151

(22) PCT Filed: Dec. 9, 2019

(86) PCT No.: PCT/JP2019/048012
§ 371 (c)(1),
(2) Date: May 26, 2021

(87) PCT Pub. No.: WO2020/121998
PCT Pub. Date: Jun. 18, 2020

(65) Prior Publication Data
US 2022/0029115 A1  Jan. 27, 2022

(30) Foreign Application Priority Data

Dec. 12, 2018 (JP) .............................. JP2018-232244
Jul. 31, 2019 (JP) .............................. JP2019-140474

(51) Int. Cl.
*H01L 25/00* (2006.01)
*H01L 31/00* (2006.01)
(Continued)

(52) U.S. Cl.
CPC .......... *H01L 51/442* (2013.01); *H01L 51/448* (2013.01); *H01L 2251/306* (2013.01); *H01L 2251/308* (2013.01)

(58) Field of Classification Search
CPC ............. H01L 51/442; H01L 2251/306; H01L 2251/308
See application file for complete search history.

(56) References Cited

U.S. PATENT DOCUMENTS

| | | |
|---|---|---|
| 2012/0211730 A1 | 8/2012 | Kasama et al. |
| 2015/0000728 A1 | 1/2015 | Maitani et al. |
| 2015/0280019 A1 | 10/2015 | Ohara et al. |

FOREIGN PATENT DOCUMENTS

| | | |
|---|---|---|
| CN | 107359248 A | 11/2017 |
| JP | 2009023854 A | 2/2009 |

(Continued)

OTHER PUBLICATIONS

Martínez-Morillas et al "Huge Photoresistance in Transparent and Conductive Indium Titanium Oxide Films Prepared by Electron Beam—Physical Vapor Deposition" ACS Appl. Mater. Interfaces 2014, 6, 1781-1787 (Year: 2014).*

(Continued)

*Primary Examiner* — Angelo Trivisonno
(74) *Attorney, Agent, or Firm* — RatnerPrestia

(57) ABSTRACT

Provided is a laminate with which an organic thin-film solar cell having excellent output characteristics, even in an LED light irradiation environment, can be obtained. A titanium oxide layer that serves as an electron transport layer and is positioned on a member that serves as an optically transparent electrode layer has a thickness of 1.0 nm to 60.0 nm, inclusive, and satisfies condition 1 or condition 2. Condition 1: The titanium oxide layer contains an indium metal and an indium oxide, wherein, if the content of elemental titanium is denoted as Ti, the content of the indium metal is denoted (Continued)

as InM, and the content of the indium oxide is denoted as InOx, the atomic ratio (InM/Ti) is 0.10 to 0.25, inclusive, and the atomic ratio (InOx/Ti) is 0.50 to 10.00, inclusive. Condition 2: The titanium oxide layer contains a tin metal and a tin oxide, wherein, if the content of the elemental titanium is denoted as Ti, the content of the tin metal is denoted as SnM, and the content of the tin oxide is denoted as SnOx, the atomic ratio (SnM/Ti) is 0.05 to 0.30, inclusive, and the atomic ratio (SnOx/Ti) is 0.50 to 10.00, inclusive.

15 Claims, 1 Drawing Sheet

(51) Int. Cl.
*H02S 10/00* (2014.01)
*H01L 51/44* (2006.01)

(56) References Cited

FOREIGN PATENT DOCUMENTS

| JP | 2009146981 A | 7/2009 |
|---|---|---|
| JP | 2015133467 A | 7/2015 |
| TW | 201424018 A | 6/2014 |
| WO | 2011019044 A1 | 2/2011 |
| WO | 2013099161 A1 | 7/2013 |

OTHER PUBLICATIONS

Abe, Titanium-doped indium oxide films prepared by d.c. magnetron sputtering using ceramic target, J Mater Sci (2006) 41:7580-7584 (Year: 2006).*

Taha, Improving the optoelectronic properties oftitanium-doped indium tin oxide thin films, Semicond. Sci. Technol. 32 (2017) 065011 (Year: 2017).*

Peng, J. et al., "Efficient indium-doped TiOx electron transport layers for high-performance perovskite solar cells and perovskite-silicon tandems", Advanced Energy Materials, Feb. 1, 2017, vol. 7 (4), 10 pages, XP055816686.

Kuwabara, T., et al., "Inverted type bulk-heterojunction organic solar cell using electrodeposited titanium oxide thin films as electron collector electrode", Thin Solid Films, May 1, 2009, vol. 517(13), pp. 3766-3769, XP026052815, [retrieved on Apr. 16, 2009].

Chigane, M. et al., "Titanium dioxide thin films prepared by electrolysis from aqueous solution of titanium-lactic add complex for dye-sensitized solar cells", Thin Solid Films, Jan. 8, 2012, vol. 520(9), pp. 3510-3514, XP028458420.

Su, T.S. et al., "Electrodeposited ultrathin $TiO_2$ blocking layers for efficient perovskite solar cells", Scientific Reports, Nov. 3, 2015, vol. 5(1), 8 pages, XP055714817.

Extended European Search Report for European Application No. 19 896 699.6, dated Feb. 9, 2022, 11 pages.

International Search Report and Written Opinion for International Application No. PCT/JP2019/048012, dated Jan. 28, 2020, 6 pages.

Jarerboon et al., "Optimization of titanium dioxide film prepared by electrophoretic deposition for dye-sensitized solar cell application", Thin Solid Films, 517, 2009, pp. 4663-4567.

Taiwanese Office Action, with Concise Statement of Relevance, for Taiwanese Application No. 108145357, dated Jul. 15, 2020, 4 pages.

Thambidural, M. et al., "Enhanced power conversion efficiency of inverted organic solar cells by using solution processed Sn-doped$TiO_2$, as an electron Iransport layer". Journal of Materials Chemistry A, 2014, 2, pp. 11426-11431.

Chigane, M. et al., "Preparation of hollow litaniom dioxide shell thin films by electrophoresis and electrolysis for dye-sensitized solarcells", Eiectrochemical and Solid-State Letters, 2009, 12(5), pp. E5-E8.

Korean Office Action for Korean Application No. 2021-7017042, dated Jan. 17, 2023, with Concise Statement of Relevance of Office Action, 10 pages.

* cited by examiner

LAMINATE, ORGANIC THIN-FILM SOLAR CELL, METHOD FOR PRODUCING LAMINATE, AND METHOD FOR PRODUCING ORGANIC THIN-FILM SOLAR CELL

CROSS REFERENCE TO RELATED APPLICATIONS

This is the U.S. National Phase application of PCT/JP2019/048012, filed Dec. 9, 2019, which claims priority to Japanese Patent Application No. 2018-232244, filed Dec. 12, 2018 and Japanese Patent Application No. 2019-140474, filed Jul. 31, 2019, the disclosures of each of these applications being incorporated herein by reference in their entireties for all purposes.

FIELD OF THE INVENTION

The present invention relates to a laminate, an organic thin-film solar cell, a method for producing a laminate, and a method for producing an organic thin-film solar cell.

BACKGROUND OF THE INVENTION

Conventionally, there has been known an organic thin-film solar cell of "normal type" that includes a light-transmissive electrode layer, a hole transport layer, an organic semiconductor layer, an electron transport layer and a collector electrode layer in this order.

Alternatively, in recent years, there has been proposed an organic thin-film solar cell of "inverted type" that includes a light-transmissive electrode layer, an electron transport layer, an organic semiconductor layer, a hole transport layer and a collector electrode layer in this order for the sake of improvement in durability and other properties (see Patent Literature 1).

PATENT LITERATURE

Patent Literature 1: JP 2009-146981 A

SUMMARY OF THE INVENTION

As described above, an organic thin-film solar cell includes, for instance, a light-transmissive electrode layer, an electron transport layer, an organic semiconductor layer, a hole transport layer and a collector electrode layer in this order.

Such an organic thin-film solar cell is recently required to demonstrate excellent output characteristics not only in an environment irradiated with sunlight, such as the outdoor environment (sunlight irradiation environment), but also in an environment irradiated with LED (Light Emitting Diode) light having a lower intensity than sunlight, such as the indoor environment (LED light irradiation environment).

An object of the present invention is to provide a laminate that serves as a light-transmissive electrode layer and an electron transport layer of an inverted type organic thin-film solar cell, which includes the light-transmissive electrode layer, the electron transport layer, an organic semiconductor layer, a hole transport layer and a collector electrode layer in this order, and that enables to obtain an organic thin-film solar cell having excellent output characteristics not only in the sunlight irradiated environment but also in the LED light irradiation environment.

Another object of the present invention is to provide a new method for producing the laminate.

The present inventors have made an intensive study and as a result found that when the configuration described below is employed, the foregoing objects are achieved. The invention has been thus completed.

Specifically, the present invention according to exemplary embodiments provides the following [1] to [9].

[1] A laminate serving as a light-transmissive electrode layer and an electron transport layer of an organic thin-film solar cell including the light-transmissive electrode layer, the electron transport layer, an organic semiconductor layer, a hole transport layer and a collector electrode layer in this order, the laminate comprising:
a member that serves as the light-transmissive electrode layer; and
a titanium oxide layer that is disposed on the member serving as the light-transmissive electrode layer and serves as the electron transport layer,
wherein the titanium oxide layer has a thickness of not less than 1.0 nm and not more than 60.0 nm, and
the titanium oxide layer satisfies Condition 1 or Condition 2 below.
Condition 1
Metallic indium and indium oxide are contained,
InM/Ti is not less than 0.10 and not more than 0.25 in atomic ratio, and
InOx/Ti is not less than 0.50 and not more than 10.00 in atomic ratio,
where an elemental titanium content is represented by "Ti," a metallic indium content is represented by "InM," and an indium oxide content is represented by "InOx."
Condition 2
Metallic tin and tin oxide are contained,
SnM/Ti is not less than 0.05 and not more than 0.30 in atomic ratio, and
SnOx/Ti is not less than 0.50 and not more than 10.00 in atomic ratio,
where an elemental titanium content is represented by "Ti," a metallic tin content is represented by "SnM," and a tin oxide content is represented by "SnOx."

[2] The laminate according to [1] above,
wherein the member serving as the light-transmissive electrode layer contains indium oxide, and
the titanium oxide layer satisfies the Condition 1.

[3] The laminate according to [1] above,
wherein the member serving as the light-transmissive electrode layer contains tin oxide, and
the titanium oxide layer satisfies the Condition 2.

[4] An organic thin-film solar cell including a light-transmissive electrode layer, an electron transport layer, an organic semiconductor layer, a hole transport layer and a collector electrode layer in this order and using the laminate according to any one of [1] to [3] above.

[5] A laminate producing method for producing the laminate according to any one of [1] to [3] above, the method comprising:
subjecting the member serving as the light-transmissive electrode layer to cathode polarization in a treatment solution containing a Ti component to thereby form the titanium oxide layer on the member serving as the light-transmissive electrode layer.

[6] The laminate producing method according to [5] above,
wherein a Ti content of the treatment solution is not less than 0.004 mol/L and not more than 1.300 mol/L.

[7] The laminate producing method according to [5] or [6] above, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

[8] The laminate producing method according to any one of [5] to [7] above, wherein current is applied at a current density of not less than 0.01 A/dm$^2$ and not more than 5.00 A/dm$^2$ with the member serving as the light-transmissive electrode layer being used as a cathode.

[9] An organic thin-film solar cell producing method for producing an organic thin-film solar cell including a light-transmissive electrode layer, an electron transport layer, an organic semiconductor layer, a hole transport layer and a collector electrode layer in this order by using the laminate according to any one of [1] to [3] above.

The present invention makes it possible to provide a laminate that serves as a light-transmissive electrode layer and an electron transport layer of an organic thin-film solar cell, which includes the light-transmissive electrode layer, the electron transport layer, an organic semiconductor layer, a hole transport layer and a collector electrode layer in this order, and that enables to obtain an organic thin-film solar cell having excellent output characteristics not only in the sunlight irradiation environment but also in the LED light irradiation environment.

The present invention also makes it possible to provide a new method for producing the laminate.

DETAILED DESCRIPTION OF EMBODIMENTS OF THE INVENTION

[Organic Thin-film Solar Cell]

First, an organic thin-film solar cell 1 is described with reference to FIG. 1.

Figure 1:
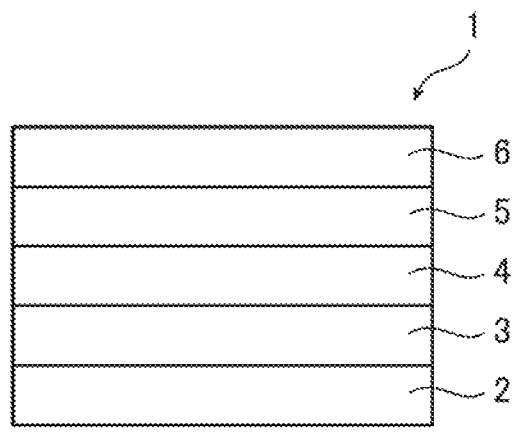
FIG. 1 is a cross-sectional view schematically showing an organic thin-film solar cell.

FIG. 1 is a cross-sectional view schematically showing the organic thin-film solar cell 1. The organic thin-film solar cell 1 includes, for instance, a light-transmissive electrode layer 2, an electron transport layer 3, an organic semiconductor layer 4, a hole transport layer 5 and a collector electrode layer 6 in this order.

The thickness of the light-transmissive electrode layer 2 is equivalent to the thickness of a member 8 (see FIG. 2) which will be described later.

The thickness of the electron transport layer 3 is equivalent to the thickness of a titanium oxide layer 9 (see FIG. 2) which will be described later.

The thicknesses of the organic semiconductor layer 4, the hole transport layer 5 and the collector electrode layer 6 are suitably specified.

A preferable example of the light-transmissive electrode layer 2 is a conductive metal oxide film such as an ITO (Indium Tin Oxide) film or an FTO (Fluorine-doped Tin Oxide) film. The light-transmissive electrode layer 2 may be disposed on a transparent substrate such as a glass substrate or a resin film.

An example of the electron transport layer 3 is a titanium oxide layer containing titanium oxide ($TiO_2$) that is an n-type semiconductor.

An example of the organic semiconductor layer 4 is a layer containing poly-3-hexylthiophene (P3HT) that is a polythiophene derivative and [6,6]-phenyl-$C_{61}$-butyric acid methyl ester (PCBM) that is a fullerene derivative.

The mass ratio between P3HT and PCBM (P3HT:PCBM) is preferably 5:3 to 5:6 and more preferably 5:3 to 5:4.

The organic semiconductor layer 4 as above may further contain additives such as a conductive material and a dye.

Examples of the conductive material include conductive materials of polyacetylene type, polypyrrole type, polythiophene type, polyparaphenylene type, polyparaphenylene vinylene type, polythienylene vinylene type, poly(3,4-ethylenedioxythiophene) type, polyfluorene type, polyaniline type, and polyacene type (except PEDOT/PSS to be described later).

Examples of the dye include dyes of cyanine type, merocyanine type, phthalocyanine type, naphthalocyanine type, azo type, quinone type, quinoisin type, quinacridone type, squarylium type, triphenylmethane type, xanthene type, porphyrin type, perylene type, and indigo type.

The additive content is preferably 1 to 100 parts by mass and more preferably 1 to 40 parts by mass with respect to 100 parts by mass in total of P3HT and PCBM.

Examples of materials for the hole transport layer 5 include PEDOT/PSS, $V_2O_5$, and $MoO_3$, with PEDOT/PSS being preferred.

PEDOT/PSS is a high molecular compound having PEDOT (poly(3,4-ethylenedioxythiophene)) and PSS (polystyrene sulfonate) combined together, and is sometimes referred to as "PEDOT:PSS."

Examples of the collector electrode layer 6 include an Au electrode layer, an Ag electrode layer, an Al electrode layer, and a Ca electrode layer, and of these, an Au electrode layer is preferred.

[Laminate]

Next, a laminate 7 that serves as the light-transmissive electrode layer 2 and the electron transport layer 3 of the organic thin-film solar cell 1 (see FIG. 1) is described with reference to FIG. 2.

Figure 2:
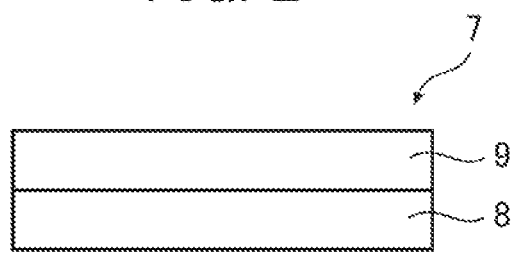
FIG. 2 is a cross-sectional view schematically showing a laminate.

FIG. 2 is a cross-sectional view schematically showing the laminate 7. The laminate 7 includes the member 8 that serves as the light-transmissive electrode layer 2 (see FIG. 1) and the titanium oxide layer 9 that is disposed on the member 8 and serves as the electron transport layer 3 (see FIG. 1).

<Member Serving as Light-transmissive Electrode Layer>

The member 8 serving as the light-transmissive electrode layer 2 (see FIG. 1) is preferably a member having electrical conductivity and more preferably a member containing indium oxide or tin oxide.

In the case of being a member containing indium oxide, the member 8 is even more preferably a member containing indium tin oxide (ITO) and particularly preferably an ITO film.

In the case of being a member containing tin oxide, the member 8 is even more preferably a member containing fluorine-doped tin oxide (FTO) and particularly preferably an FTO film.

The member 8 may be disposed on a transparent substrate such as a glass substrate or a resin film.

The thickness of the member 8 that is for example an ITO film or an FTO film is appropriately specified in accordance with the resulting organic thin-film solar cell 1 (see FIG. 1) and is preferably not less than 20 nm, more preferably not less than 80 nm, and even more preferably not less than 150 nm, and, at the same time, preferably not more than 500 nm, more preferably not more than 400 nm, and even more preferably not more than 300 nm.

The thickness of the member 8 is a value determined by forming a cross section of the member 8 with a focused ion beam and measuring the formed cross section with a scanning electron microscope.

<Titanium Oxide Layer>

The titanium oxide layer 9 is a layer containing titanium oxide.

The titanium oxide layer 9 further contains metallic indium and indium oxide, or metallic tin and tin oxide, which will be described later.

<<Thickness>>

The titanium oxide layer 9 has a thickness of not less than 1.0 nm and not more than 60.0 nm. This configuration allows the organic thin-film solar cell 1 using the laminate 7 to demonstrate excellent output characteristics not only in the sunlight irradiation environment but also in the LED light irradiation environment.

When the titanium oxide layer 9 has a thickness of less than 1.0 nm, a defect is easily generated in the titanium oxide layer 9 so that current leakage may occur, resulting in insufficient output characteristics.

When the titanium oxide layer 9 has a thickness of more than 60.0 nm, the resistance increases and this also results in a decrease in output.

The thickness of the titanium oxide layer 9 is preferably not less than 2.0 nm, more preferably not less than 3.0 nm and even more preferably not less than 4.0 nm because this leads to further excellent output characteristics.

For the same reason, the thickness of the titanium oxide layer 9 is preferably not more than 30.0 nm, more preferably not more than 20.0 nm, and even more preferably not more than 15.0 nm.

The thickness of the titanium oxide layer 9 is determined as follows.

First, for a given region of the titanium oxide layer 9, measurement of narrow-range photoelectron spectra of Ti3s, In3d and Sn3d by means of an X-ray photoelectron spectroscope (XPS device) and sputtering using argon ions ($Ar^+$) are repeatedly carried out under the conditions stated below. By this process, element compositional proportions (unit: at %) in the depth direction of sputtering in the titanium oxide layer 9 are obtained. A relative sensitivity factor method is adopted for determination of the element compositional proportions. As the relative sensitivity factors for the peak areas of narrow-range photoelectron spectra, Ti3s: 0.150, In3d: 4.530 and Sn3d: 4.890 are used. A distance from the uppermost surface of the titanium oxide layer 9, which is the measurement starting position, to the depth position where the element compositional proportion of titanium (Ti) is 1/10 of the maximum value is defined as the thickness of the titanium oxide layer 9.

(Conditions of Measurement with XPS Device)

XPS device: Quantera SXM (manufactured by ULVAC-PHI, Inc.)

X-ray source: Monochromatic Al—Kα ray (voltage: 15 kV, output: 25.0 W)

X-ray beam diameter: 100-μm diameter

Measurement range: 100-μm diameter

Pass Energy of narrow-range photoelectron spectrum measurement: 140 eV

Energy Step of narrow-range photoelectron spectrum measurement: 0.125 eV

Sputtering rate: 5.4 nm/min (in terms of $SiO_2$)

$Ar^+$ acceleration energy: 1 keV

Charge neutralization: Electron beam+$Ar^+$

<<Condition 1 or Condition 2>>

The titanium oxide layer 9 satisfies Condition 1 or Condition 2 described below. This configuration allows the organic thin-film solar cell 1 using the laminate 7 to demonstrate excellent output characteristics not only in the sunlight irradiation environment but also in the LED light irradiation environment.

It is presumed that when the titanium oxide layer 9 satisfies Condition 1 or Condition 2 described below, metallic indium or metallic tin is deposited inside the titanium oxide layer 9 and at the interface between the titanium oxide layer 9 and the member 8. This probably causes improved electrical conductivity and decreased electron transfer resistance, thus resulting in excellent output characteristics. However, any other mechanisms than the foregoing are also regarded as being within the scope of the invention.

In the case where the titanium oxide layer 9 satisfies Condition 1 below, it is preferable that the member 8 contain indium oxide. In the case where the titanium oxide layer 9 satisfies Condition 2 below, it is preferable that the member 8 contain tin oxide.

(Condition 1)

Metallic indium and indium oxide are contained.

The atomic ratio (InM/Ti) is not less than 0.10 and not more than 0.25, and the atomic ratio (InOx/Ti) is not less than 0.50 and not more than 10.00, where the elemental titanium content is represented by "Ti," the metallic indium content "InM," and the indium oxide content "InOx."

The atomic ratio (InM/Ti) is preferably not less than 0.15 and more preferably not less than 0.21 because the output characteristics can become more excellent. For the upper limit value, the atomic ratio (InM/Ti) is preferably not more than 0.24 and more preferably not more than 0.23.

The atomic ratio (InOx/Ti) is preferably not less than 4.00 and more preferably not less than 7.50 because similarly the output characteristics can become more excellent. For the upper limit value, the atomic ratio (InOx/Ti) is preferably not more than 9.90 and more preferably not more than 9.70.

(Condition 2)

Metallic tin and tin oxide are contained.

The atomic ratio (SnM/Ti) is not less than 0.05 and not more than 0.30, and the atomic ratio (SnOx/Ti) is not less than 0.50 and not more than 10.00, where the elemental titanium content is represented by "Ti," the metallic tin content "SnM," and the tin oxide content "SnOx."

The atomic ratio (SnM/Ti) is preferably not less than 0.16 and more preferably not less than 0.22 because the output characteristics can become more excellent. For the upper limit value, the atomic ratio (SnM/Ti) is preferably not more than 0.26 and more preferably not more than 0.28.

The atomic ratio (SnOx/Ti) is preferably not less than 4.00 and more preferably not less than 7.50 because similarly the output characteristics can become more excellent. For the upper limit value, the atomic ratio (SnOx/Ti) is preferably not more than 9.90 and more preferably not more than 9.70.

The atomic ratios (InM/Ti) and (InOx/Ti), or the atomic ratios (SnM/Ti) and (SnOx/Ti) are determined as follows.

First, the measurement using an XPS device is carried out on the titanium oxide layer 9 in the same manner as described above. Next, the obtained narrow-range photoelectron spectra of In3d and Sn3d are subjected to peak separation to divide into a metal component and an oxide component. More precisely, in the peak separation, function fitting is carried out using MultiPak (Ver. 8.2C) as software.

For metal components, an asymmetric function (tail length: 14.85±3.00, tail scale: 0.23±0.10) is applied. For oxides, a Gaussian-Lorentzian function is applied.

Note that metallic indium and indium oxide have peak positions close to each other. To cope with it, with the ranges thereof being fixed to those specified below, and the peak heights, the half-widths and the Gaussian function ratio being used as variable parameters, convergence calculation is carried out such that a residual sum of squares with respect to the actually measured spectrum becomes minimum.

Metallic indium: 443.8±0.5 eV

Indium oxide: 444.6±0.5 eV

Element compositional proportions (unit: at %) of titanium (Ti), metallic indium, indium oxide, metallic tin and tin oxide are integrated from the uppermost surface of the titanium oxide layer 9 to the depth position where the element compositional proportion of titanium (Ti) is ¹/₁₀ of the maximum value, thereby obtaining their integration values.

Each of the integration value of metallic indium (InM), the integration value of indium oxide (InOx), the integration value of metallic tin (SnM) and the integration value of tin oxide (SnOx) is divided by the integration value of titanium (Ti). Thus, the atomic ratios (InM/Ti), (InOx/Ti), (SnM/Ti) and (SnOx/Ti) are obtained.

[Method for Producing Laminate]

The laminate 7 described above is produced.

To be more specific, the member 8 is subjected to cathode polarization in a treatment solution containing a Ti component. That is, current is applied with the member 8 being used as the cathode. Consequently, the titanium oxide layer 9 is formed on the member 8. It is presumed that through this cathode polarization, metallic indium or metallic tin is deposited inside the titanium oxide layer 9 and at the interface between the titanium oxide layer 9 and the member 8 (e.g., an ITO film, an FTO film). For the counter electrode, an insoluble electrode such as a platinum electrode is suitable.

It is presumed that the titanium oxide layer 9 is formed as follows. First, upon generation of hydrogen, the pH increases at the surface of the member 8. As a result, when the Ti component in the treatment solution is hexafluorotitanic acid and/or its salt for instance, hexafluorotitanic acid ions in the treatment solution generate titanium hydroxide while being defluorinated. This titanium hydroxide adheres to the surface of the member 8, and through subsequent washing and dehydration condensation by drying or the like, the titanium oxide layer 9 is formed. However, any other mechanisms than the foregoing are also regarded as being within the scope of the invention.

As described above, the member 8 is preferably a member having electrical conductivity, e.g., a conductive metal oxide film such as an ITO film or an FTO film.

The member 8 may be disposed on a transparent substrate such as a glass substrate or a resin film, as described above. In this case, the transparent substrate having the member 8 (e.g., an ITO film-bearing glass substrate) is subjected to cathode polarization. In this case, the resulting laminate is to include this transparent substrate.

The treatment solution contains a Ti component (Ti compound) for supplying Ti (elemental titanium) to the titanium oxide layer 9 to be formed.

As the Ti component, preferred is at least one selected from the group consisting of hexafluorotitanic acid ($H_2TiF_6$), potassium hexafluorotitanate ($K_2TiF_6$), sodium hexafluorotitanate ($Na_2TiF_6$), ammonium hexafluorotitanate (($NH_4)_2TiF_6$), ammonium titanyl oxalate (($NH_4)_2[TiO(C_2O_4)_2]$), potassium titanyl oxalate dihydrate ($K_2[TiO(C_2O_4)_2].2H_2O$), titanium sulfate ($Ti(SO_4)_2$), and titanium lactate ($Ti(OH)_2[OCH(CH_3)COOH]_2$).

Of these, hexafluorotitanic acid and/or its salts (potassium hexafluorotitanate, sodium hexafluorotitanate, ammonium hexafluorotitanate) are preferred for the sake of stability of the treatment solution, availability, and other factors.

The Ti content of the treatment solution is preferably not less than 0.004 mol/L, more preferably not less than 0.010 mol/L, and even more preferably not less than 0.020 mol/L.

At the same time, the Ti content of the treatment solution is preferably not more than 1.300 mol/L, more preferably not more than 1.000 mol/L, even more preferably not more than 0.700 mol/L, particularly preferably not more than 0.300 mol/L, and most preferably not more than 0.150 mol/L.

Water is used as a solvent of the treatment solution.

The pH of the treatment solution is not particularly limited and is for example 2.0 to 5.0. Known acid components (e.g., phosphoric acid, sulfuric acid) or alkaline components (e.g., sodium hydroxide, ammonia water) may be used for pH adjustment.

The treatment solution may optionally contain a surfactant such as sodium lauryl sulfate or acetylenic glycol. The treatment solution may also contain condensed phosphate such as pyrophosphate for the sake of stability of deposition behavior over time.

The treatment solution has a temperature preferably of 20° C. to 80° C. and more preferably of 40° C. to 60° C.

The treatment solution may further contain a conduction aid.

Exemplary conduction aids include: sulfates such as potassium sulfate, sodium sulfate, magnesium sulfate and calcium sulfate; nitrates such as potassium nitrate, sodium nitrate, magnesium nitrate and calcium nitrate; and chloride salts such as potassium chloride, sodium chloride, magnesium chloride and calcium chloride.

The conduction aid content of the treatment solution is preferably 0.010 to 1.000 mol/L and more preferably 0.020 to 0.500 mol/L.

The current density during cathode polarization is preferably not less than 0.01 A/dm$^2$, more preferably not less than 0.10 A/dm$^2$, and even more preferably not less than 0.20 A/dm$^2$.

At the same time, the current density during cathode polarization is preferably not more than 5.00 A/dm$^2$, more preferably not more than 4.00 A/dm$^2$, and even more preferably not more than 1.00 A/dm$^2$. When the current density is within the foregoing range, an influence of hydrogen gas generated from the surface of the member 8 can be minimized, thus making it easy to obtain a desired thickness of the titanium oxide layer 9.

The current application time is suitably specified to obtain a desired thickness of the titanium oxide layer 9.

Cathode polarization may be followed by washing with water.

The washing method is not particularly limited, and one exemplary method is immersion in water after cathode polarization. The temperature of water (water temperature) for use in washing is preferably 40° C. to 90° C.

The washing time is preferably more than 0.5 seconds and preferably 1.0 to 5.0 seconds.

Further, drying may replace or follow the washing with water. The temperature and the method of drying are not particularly limited, and a drying process using a typical drier or electric furnace may be employed for example. The drying temperature is preferably not higher than 100° C.

[Method for Producing Organic Thin-Film Solar Cell]

The organic thin-film solar cell 1 including the light-transmissive electrode layer 2, the electron transport layer 3, the organic semiconductor layer 4, the hole transport layer 5 and the collector electrode layer 6 in this order is produced using the above-described laminate 7.

For instance, layers serving as the organic semiconductor layer 4, the hole transport layer 5 and the collector electrode layer 6 are sequentially formed on the titanium oxide layer 9 in the laminate 7.

The organic semiconductor layer 4 is formed by, for example, spin-coating a solution having P3HT and PCBM dissolved therein onto the titanium oxide layer 9 serving as the electron transport layer 3, followed by drying. Examples of a solvent of the solution include 2,6-dichlorotoluene, chloroform, chlorobenzene, and a mixture of two or more thereof.

The hole transport layer 5 is formed by, for example, spin-coating an aqueous dispersion of PEDOT/PSS onto the organic semiconductor layer 4, followed by drying.

The collector electrode layer 6 is formed by, for example, vapor-depositing metal such as Au onto the hole transport layer 5.

The methods for forming the respective layers are not limited to the foregoing methods, and known methods may be suitably used.

EXAMPLES

The present invention is specifically described below with reference to examples. However, the present invention should not be construed as being limited to the following examples.

[Test 1]

<Preparation of Member Serving as Light-transmissive Electrode Layer>

Prepared was an ITO film-bearing glass substrate (sheet resistance: 10 Ω/sq, manufactured by Ideal Star Inc.) having an ITO (Indium Tin Oxide) film laminated on one surface of a glass substrate (30 mm×35 mm, thickness: 0.7 mm, alkali-free glass) by sputtering. This ITO film-bearing glass substrate was used as a transparent substrate having a member serving as the light-transmissive electrode layer.

<Production of Laminate Serving as Light-transmissive Electrode Layer and Electron Transport Layer>

A laminate serving as the light-transmissive electrode layer and the electron transport layer was produced using the prepared ITO film-bearing glass substrate (the transparent substrate having the member serving as the light-transmissive electrode layer) in the following manner.

First, prepared was a treatment solution containing 0.040 mol/L of potassium hexafluorotitanate ($K_2TiF_6$) and 0.10 mol/L of potassium sulfate ($K_2SO_4$) and having the pH adjusted to 4.0 by use of potassium hydroxide (hereinafter simply called "treatment solution").

Next, the prepared ITO film-bearing glass substrate was immersed in a cleaning solution having Semiclean M-4 (manufactured by Yokohama Oils & Fats Industry Co., Ltd.) diluted by 20 times with ion exchanged water, and subjected to ultrasonic cleaning for 10 minutes. Thereafter, the ITO film-bearing glass substrate was taken out from the cleaning solution, immersed in ion exchanged water, and subjected to ultrasonic cleaning for 10 minutes.

The cleaned ITO film-bearing glass substrate was immersed in the prepared treatment solution (solution temperature: 50° C.). The ITO film-bearing glass substrate was subjected to cathode polarization in the treatment solution under the conditions of a current density of 0.40 A/dm² and a current application time of 20 seconds. Then, the ITO film-bearing glass substrate was immersed in a water bath at 25° C. for 2.0 seconds for washing with water, and then dried by a blower at room temperature. Thus, a titanium oxide layer serving as the electron transport layer with a thickness of about 50 nm was formed on the ITO film of the ITO film-bearing glass substrate. The ITO film-bearing glass substrate having the titanium oxide layer formed thereon (a laminate serving as the light-transmissive electrode layer and the electron transport layer) was produced in this manner.

<Production of Organic Thin-Film Solar Cell>

An organic thin-film solar cell having a photoelectric conversion area of 4 mm×25 mm, that is, 1.0 cm² was produced using the produced laminate in the following manner.

<<Formation of Organic Semiconductor Layer>>

A mixed solution was obtained by mixing 2,6-dichlorotoluene and chloroform at a volume ratio of 1:1. To this mixed solution, P3HT (manufactured by Aldrich) and PCBM (manufactured by Frontier Carbon Corporation) were dissolved at a mass ratio of 5:4 such that the total concentration was 3.9 mass %.

The thus-obtained mixed solution was spin-coated onto the titanium oxide layer under the conditions of 1500 rpm and 60 seconds and dried at room temperature for about 10 minutes, thereby obtaining an organic semiconductor layer with a thickness of 250 nm.

<<Formation of Hole Transport Layer>>

Prepared was a nonionic surfactant (manufactured by Aldrich) containing 1 mass % of polyoxyethylene tridecyl ether ($C_{13}H_{27}(OCH_2CH_2)_6OH$) and 1 mass % of xylene and having water and isopropanol as solvents. This nonionic surfactant was mixed in an amount of 0.5 parts by mass with respect to 100 parts by mass of 1.3 mass % aqueous PEDOT/PSS dispersion (manufactured by Aldrich) to obtain a PTE-containing aqueous PEDOT/PSS dispersion.

The PTE-containing aqueous PEDOT/PSS dispersion was heated to 70° C., spin-coated onto the organic semiconductor layer under the conditions of 6000 rpm and 60 seconds, and then naturally dried at room temperature, thereby forming a hole transport layer with a thickness of 80 nm.

<<Formation of Collector Electrode Layer>>

An Au electrode layer (collector electrode layer) was formed on the hole transport layer by vacuum deposition to have a thickness of about 100 nm.

More specifically, a shadow mask corresponding to an electrode shape of 4 mm×25 mm and the glass substrate on which the layers up to the hole transport layer had been formed were placed in a chamber. The pressure in the chamber was reduced using a rotary pump and a turbomolecular pump to achieve a pressure of not higher than $2\times10^{-3}$ Pa in the chamber. A gold wire was subjected to resistance heating in the chamber to form, via the shadow mask, a film of gold with a thickness of 100 nm on the hole transport layer. The film formation rate was set to 10 to 15 nm/min, and the pressure during the film formation was not higher than $1\times10^{-2}$ Pa.

The thus-obtained glass substrate on whose one surface the ITO film (light-transmissive electrode layer), the titanium oxide layer (electron transport layer), the organic semiconductor layer, the hole transport layer and the collector electrode layer had been formed was heated at 150° C. for 5 minutes and further held at 70° C. for 1 hour. Thereafter, atmospheric sealing was made. Thus, an organic thin-film solar cell was produced.

<Evaluation on Organic Thin-Film Solar Cell>

The following evaluation was conducted with the produced organic thin-film solar cell.

The organic thin-film solar cell was irradiated, from its ITO film side, with artificial sunlight having a spectrum distribution of AM 1.5G (IEC standard 60904-3) and a light intensity of 100 mW/cm$^2$ by use of a solar simulator (XES-502S, manufactured by SAN-EI Electric Co., Ltd.). In this state, a photocurrent-voltage profile of the organic thin-film solar cell was measured with a linear sweep voltammetry (LSV) measurement device (HZ-5000, manufactured by Hokuto Denko Corporation).

From this profile, those values were calculated: short-circuit current (absolute value, Jsc): 3.37 mA/cm$^2$, open-circuit voltage (Voc): 0.528 V, fill factor (FF): 0.52, and power conversion efficiency (PCE): 0.91%.

[Test 2]

<Preparation of Member Serving as Light-transmissive Electrode Layer>

<<ITO Film-bearing Glass Substrate>>

An ITO film-bearing glass substrate identical to that used in Test 1 was prepared. The thickness of the ITO film was 150 nm. This ITO film-bearing glass substrate was used as a transparent substrate having a member serving as the light-transmissive electrode layer.

<<FTO Film-bearing Glass Substrate>>

Prepared was an FTO film-bearing glass substrate (sheet resistance: 10Ω/sq, manufactured by Ideal Star Inc.) in which an FTO (Fluorine-doped Tin Oxide) film was laminated on one surface of a glass substrate (30 mm×35 mm, thickness: 0.7 mm, alkali-free glass) by sputtering to prepare. The thickness of the FTO film was 150 nm. This FTO film-bearing glass substrate was used as a transparent substrate having a member serving as the light-transmissive electrode layer.

<Production of Laminate Serving as Light-transmissive Electrode Layer and Electron Transport Layer>

<<ITO Film-Bearing Glass Substrate Having Titanium Oxide Layer Formed Thereon>>

Cathode polarization was carried out with the thus-prepared ITO film-bearing glass substrate (transparent substrate having the member serving as the light-transmissive electrode layer) under the relevant conditions shown in Table 1 below. In the same manner as in Test 1 except for this step, an ITO film-bearing glass substrate having a titanium oxide layer formed thereon (a laminate serving as the light-transmissive electrode layer and the electron transport layer) was produced.

The laminates thus produced were used for Nos. 1 to 5 and 8 to be described later.

<<FTO Film-Bearing Glass Substrate Having Titanium Oxide Layer Formed Thereon>>

A laminate serving as the light-transmissive electrode layer and the electron transport layer was produced using the prepared FTO film-bearing glass substrate (the transparent substrate having the member serving as the light-transmissive electrode layer) in the following manner.

First, prepared was a treatment solution containing 0.040 mol/L of potassium hexafluorotitanate ($K_2TiF_6$) and 0.10 mol/L of potassium sulfate ($K_2SO_4$) and having the pH adjusted to 4.0 by use of potassium hydroxide (hereinafter simply called "treatment solution").

Next, the prepared FTO film-bearing glass substrate was immersed in a cleaning solution having Semiclean M-4 (manufactured by Yokohama Oils & Fats Industry Co., Ltd.) diluted by 20 times with ion exchanged water, and subjected to ultrasonic cleaning for 10 minutes. Thereafter, the FTO film-bearing glass substrate was taken out from the cleaning solution, immersed in ion exchanged water, and subjected to ultrasonic cleaning for 10 minutes.

The cleaned FTO film-bearing glass substrate was immersed in the prepared treatment solution (solution temperature: 50° C.). Cathode polarization was carried out in the treatment solution under the relevant conditions shown in Table 1 below. Then, the FTO film-bearing glass substrate was immersed in a water bath at 25° C. for 2.0 seconds for washing with water, followed by drying by a blower at room temperature. Thus, a titanium oxide layer serving as the electron transport layer was formed on the FTO film of the FTO film-bearing glass substrate. The FTO film-bearing glass substrate having the titanium oxide layer formed thereon (a laminate serving as the light-transmissive electrode layer and the electron transport layer) was produced in this manner. The laminate thus produced was used for No. 7 to be described later.

<<Production of Comparative Laminate>>

First, 6.25 mmol of titanium tetraisopropoxide was added to 12.5 mL of 2-methoxyethanol, and the mixture was cooled in an ice bath for 10 minutes. Subsequently, 12.5 mmol of acetylacetone was added thereto, and the mixture was stirred in an ice bath for 10 minutes to thereby obtain a mixed solution. The obtained mixed solution was heated at 80° C. for 2 hours and then refluxed for 1 hour. Finally, the mixed solution was cooled to room temperature, thereby obtaining a titanium oxide precursor solution. The atmosphere in each step was a nitrogen atmosphere.

Next, the titanium oxide precursor solution was spin-coated on the ITO film of the ITO film-bearing glass substrate, which had been cleaned, under the conditions of a rotational speed of 2000 rpm and a rotational time of 60 seconds to form a coating. Thereafter, the resultant was left in air to hydrolyze a titanium oxide precursor in the coating. Then, heating treatment at 150° C. for 1 hour was carried out to obtain a titanium oxide layer with a thickness of 30.0 nm.

A laminate (comparative laminate) thus produced was used for No. 6 to be described later.

Further, similarly, a titanium oxide layer with a thickness of 30.0 nm was formed on the FTO film of the FTO film-bearing glass substrate having been cleaned, thereby producing a laminate (comparative laminate). The laminate thus produced was used for No. 9 to be described later.

<Thickness of Titanium Oxide Layer and Atomic Ratio>

The thickness of the titanium oxide layer, and the atomic ratios (InM/Ti) and (InOx/Ti) or the atomic ratios (SnM/Ti) and (SnOx/Ti) were obtained in the above-described manners. The results are shown in Table 1 below.

<Production of Organic Thin-Film Solar Cell>

An organic thin-film solar cell was produced using each of the produced laminates in the same manner as in Test 1.

<Evaluation on Organic Thin-Film Solar Cell>

<<Sunlight Irradiation Environment>>

The following evaluations were conducted with the produced organic thin-film solar cells with atmospheric sealing.

Each organic thin-film solar cell was irradiated, from its ITO or FTO film side, with artificial sunlight having a spectrum distribution of AM 1.5G (IEC standard 60904-3) and a light intensity of 100 mW/cm$^2$ by use of a solar simulator (XES-502S, manufactured by SAN-EI Electric Co., Ltd.). In this state, a photocurrent-voltage profile of the organic thin-film solar cell was measured with a linear sweep voltammetry (LSV) measurement device (HZ-5000, manufactured by Hokuto Denko Corporation). The maximum output was determined based on the obtained profile and evaluated according to the following criteria. The results are shown in Table 1 below. With a larger maximum output value, the output characteristics are rated as more excellent.

A: Maximum output of not less than 2.00 mW/cm$^2$
B: Maximum output of not less than 1.00 mW/cm$^2$ and less than 2.00 mW/cm$^2$
C: Maximum output of less than 1.00 mW/cm$^2$ <<LED Light Irradiation Environment>>

The following evaluations were conducted with the produced organic thin-film solar cells with atmospheric sealing.

Each organic thin-film solar cell was irradiated, from its ITO or FTO film side, with LED light having a light intensity of 10 mW/cm$^2$ by use of an LED desk lamp (SQ-LD515, manufactured by Panasonic Corporation). In this state, a photocurrent-voltage profile of the organic thin-film solar cell was measured with a linear sweep voltammetry (LSV) measurement device (HZ-5000, manufactured by Hokuto Denko Corporation). The maximum output was determined based on the obtained profile and evaluated according to the following criteria. The results are shown in Table 1 below. With a larger maximum output value, the output characteristics are rated as more excellent.

A: Maximum output of not less than 0.14 mW/cm$^2$
B: Maximum output of not less than 0.09 mW/cm$^2$ and less than 0.14 mW/cm$^2$
C: Maximum output of less than 0.09 mW/cm$^2$

TABLE 1

| No. | Member serving as light-transmissive electrode layer | Condition for cathode polarization | | Titanium oxide layer | | | | | Evaluation | | Remarks |
|---|---|---|---|---|---|---|---|---|---|---|---|
| | | Current density [A/dm$^2$] | Current application time [s] | Thickness [nm] | InM/Ti | InOx/Ti | SnM/Ti | SnOx/Ti | Sunlight | LED light | |
| 1 | ITO film | 0.50 | 6 | 2.0 | 0.22 | 9.50 | — | — | A | A | Inventive example |
| 2 | ITO film | 0.50 | 8 | 4.0 | 0.21 | 8.50 | — | — | A | A | Inventive example |
| 3 | ITO film | 0.50 | 10 | 12.2 | 0.20 | 7.30 | — | — | B | B | Inventive example |
| 4 | ITO film | 0.50 | 20 | 50.0 | 0.17 | 1.10 | — | — | B | B | Inventive example |
| 5 | ITO film | 0.50 | 30 | 65.0 | 0.12 | 0.90 | — | — | C | C | Comparative example |
| 6 | ITO film | — | — | 30.0 | 0.00 | 0.40 | — | — | B | C | Comparative example |
| 7 | FTO film | 0.50 | 8 | 6.0 | — | — | 0.24 | 8.00 | A | A | Inventive example |
| 8 | ITO film | 5.00 | 0.3 | 4.0 | 0.21 | 8.75 | — | — | A | A | Inventive example |
| 9 | FTO film | — | — | 30.0 | — | — | 0.00 | 0.35 | B | C | Comparative example |

<Summary of Evaluation Results>

As can be seen from Table 1 above, in Nos. 1 to 4, 7 and 8 with the titanium oxide layer having a suitable thickness and Conditions 1 and 2 being satisfied, the output characteristics were excellent not only in the sunlight irradiation environment but also in the LED light irradiation environment.

In contrast, in No. 5 with too thick a titanium oxide layer, the output characteristics were insufficient in both the sunlight irradiation environment and the LED light irradiation environment.

In No. 6 with Condition 1 being not satisfied and No. 9 with Condition 2 being not satisfied, the output characteristics were insufficient in the LED light irradiation environment.

REFERENCE SIGNS LIST 1 organic thin-film solar cell
2 light-transmissive electrode layer
3 electron transport layer
4 organic semiconductor layer
5 hole transport layer
6 collector electrode layer
7 laminate
8 member serving as a light-transmissive electrode layer
9 titanium oxide layer

The invention claimed is:

1. A laminate serving as a light-transmissive electrode layer and an electron transport layer of an organic thin-film solar cell including the light-transmissive electrode layer, the electron transport layer, an organic semiconductor layer, a hole transport layer and a collector electrode layer in this order, the laminate comprising:
a member that serves as the light-transmissive electrode layer; and
a titanium oxide layer that is disposed on the member serving as the light-transmissive electrode layer and serves as the electron transport layer,
wherein the titanium oxide layer has a thickness of not less than 1.0 nm and not more than 60.0 nm, and the titanium oxide layer satisfies Condition 1 or Condition 2 below:

Condition 1
metallic indium and indium oxide are contained,
InM/Ti is not less than 0.10 and not more than 0.25 in atomic ratio, and
InOx/Ti is not less than 0.50 and not more than 10.00 in atomic ratio,
where an elemental titanium content is represented by "Ti," a metallic indium content is represented by "InM," and an indium oxide content is represented by "InOx";

Condition 2
metallic tin and tin oxide are contained,
SnM/Ti is not less than 0.05 and not more than 0.30 in atomic ratio, and
SnOx/Ti is not less than 0.50 and not more than 10.00 in atomic ratio,
where an elemental titanium content is represented by "Ti," a metallic tin content is represented by "SnM," and a tin oxide content is represented by "SnOx."

2. The laminate according to claim 1, wherein the member serving as the light-transmissive electrode layer contains indium oxide, and the titanium oxide layer satisfies the Condition 1.

3. The laminate according to claim 1, wherein the member serving as the light-transmissive electrode layer contains tin oxide, and the titanium oxide layer satisfies the Condition 2.

4. An organic thin-film solar cell including a light-transmissive electrode layer, an electron transport layer, an organic semiconductor layer, a hole transport layer and a collector electrode layer in this order and using the laminate according to claim 1.

5. An organic thin-film solar cell including a light-transmissive electrode layer, an electron transport layer, an organic semiconductor layer, a hole transport layer and a collector electrode layer in this order and using the laminate according to claim 2.

6. An organic thin-film solar cell including a light-transmissive electrode layer, an electron transport layer, an organic semiconductor layer, a hole transport layer and a collector electrode layer in this order and using the laminate according to claim 3.

7. A laminate producing method for producing the laminate according to claim 1, the method comprising:
   subjecting the member serving as the light-transmissive electrode layer to cathode polarization in a treatment solution containing a Ti component to thereby form the titanium oxide layer on the member serving as the light-transmissive electrode layer.

8. A laminate producing method for producing the laminate according to claim 2, the method comprising:
   subjecting the member serving as the light-transmissive electrode layer to cathode polarization in a treatment solution containing a Ti component to thereby form the titanium oxide layer on the member serving as the light-transmissive electrode layer.

9. A laminate producing method for producing the laminate according to claim 3, the method comprising:
   subjecting the member serving as the light-transmissive electrode layer to cathode polarization in a treatment solution containing a Ti component to thereby form the titanium oxide layer on the member serving as the light-transmissive electrode layer.

10. The laminate producing method according to claim 7, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

11. The laminate producing method according to claim 8, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

12. The laminate producing method according to claim 9, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

13. An organic thin-film solar cell producing method for producing an organic thin-film solar cell including a light-transmissive electrode layer, an electron transport layer, an organic semiconductor layer, a hole transport layer and a collector electrode layer in this order by using the laminate according to claim 1.

14. An organic thin-film solar cell producing method for producing an organic thin-film solar cell including a light-transmissive electrode layer, an electron transport layer, an organic semiconductor layer, a hole transport layer and a collector electrode layer in this order by using the laminate according to claim 2.

15. An organic thin-film solar cell producing method for producing an organic thin-film solar cell including a light-transmissive electrode layer, an electron transport layer, an organic semiconductor layer, a hole transport layer and a collector electrode layer in this order by using the laminate according to claim 3.

* * * * *